(12) United States Patent
Kim et al.

(10) Patent No.: US 10,840,318 B2
(45) Date of Patent: Nov. 17, 2020

(54) THIN FILM TRANSISTOR AND METHOD OF MANUFACTURING THE SAME, AND ORGANIC LIGHT-EMITTING DISPLAY DEVICE INCLUDING THE SAME

(71) Applicant: SAMSUNG DISPLAY CO., LTD., Yongin-si (KR)

(72) Inventors: Deokhoi Kim, Yongin-si (KR); Seunggyu Tae, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 20 days.

(21) Appl. No.: 15/455,563

(22) Filed: Mar. 10, 2017

(65) Prior Publication Data

US 2017/0271422 A1 Sep. 21, 2017

(30) Foreign Application Priority Data

Mar. 18, 2016 (KR) ........................ 10-2016-0032914

(51) Int. Cl.
*H01L 27/32* (2006.01)
*H01L 51/52* (2006.01)
*H01L 27/12* (2006.01)

(52) U.S. Cl.
CPC ........ *H01L 27/3262* (2013.01); *H01L 27/124* (2013.01); *H01L 27/1222* (2013.01); *H01L 27/1248* (2013.01); *H01L 2227/323* (2013.01)

(58) Field of Classification Search
CPC ................................ H01L 27/32; H01L 51/52
USPC ........................................ 257/59, 71; 438/29
See application file for complete search history.

(56) References Cited

U.S. PATENT DOCUMENTS

| | | | |
|---|---|---|---|
| 7,867,797 B2 | 1/2011 | Jo et al. | |
| 8,288,182 B2 | 10/2012 | Ji et al. | |
| 2003/0194484 A1* | 10/2003 | Yamazaki | ............... C23C 14/24 427/66 |
| 2005/0184652 A1* | 8/2005 | Maruyama | ........... G09G 3/3233 313/504 |
| 2006/0076887 A1* | 4/2006 | Kang | .................. H01L 27/3246 313/512 |
| 2007/0267648 A1* | 11/2007 | Hwang | ............... H01L 27/3253 257/99 |

(Continued)

FOREIGN PATENT DOCUMENTS

| | | |
|---|---|---|
| JP | 2001-094110 | 4/2001 |
| KR | 10-2009-0028166 | 3/2009 |

(Continued)

*Primary Examiner* — Sheng-Bai Zhu
(74) *Attorney, Agent, or Firm* — F. Chau & Associates, LLC

(57) ABSTRACT

An organic light emitting display device is provided as follows. A first thin film transistor having a first semiconductor pattern is disposed on a substrate. A second thin film transistor having a second semiconductor pattern is disposed on the substrate. An insulating layer covers the first thin film transistor and the second thin film transistor. At least one first dummy hole passing through the insulating layer overlaps the first semiconductor pattern of the first thin film transistor. At least one second dummy hole passing through the insulating layer overlaps the second semiconductor pattern of the second thin film transistor. Numbers or sizes of the at least one first dummy hole and the at least one second dummy hole are different from each other.

18 Claims, 20 Drawing Sheets

(56) References Cited

U.S. PATENT DOCUMENTS

| | | | | |
|---|---|---|---|---|
| 2008/0246029 A1* | 10/2008 | Kang | ................... | H01L 27/12 |
| | | | | 257/40 |
| 2009/0026932 A1* | 1/2009 | Kwak | ................ | H01L 27/3272 |
| | | | | 313/504 |
| 2009/0251048 A1* | 10/2009 | Choi | ................... | H01L 27/322 |
| | | | | 313/504 |
| 2010/0001287 A1* | 1/2010 | Ahn | ................ | H01L 29/66757 |
| | | | | 257/72 |
| 2012/0138942 A1* | 6/2012 | Segawa | ............... | H01L 27/1233 |
| | | | | 257/59 |
| 2012/0326174 A1* | 12/2012 | Park | ................. | H01L 29/42384 |
| | | | | 257/88 |
| 2013/0032803 A1* | 2/2013 | Moon | ................ | H01L 51/5271 |
| | | | | 257/59 |
| 2014/0070184 A1* | 3/2014 | Shin | ....................... | H01L 51/52 |
| | | | | 257/40 |
| 2014/0167050 A1 | 6/2014 | Jin et al. | | |

FOREIGN PATENT DOCUMENTS

| KR | 10-2011-0081694 | 7/2011 |
|---|---|---|
| KR | 10-2014-0077023 | 6/2014 |

\* cited by examiner

THIN FILM TRANSISTOR AND METHOD OF MANUFACTURING THE SAME, AND ORGANIC LIGHT-EMITTING DISPLAY DEVICE INCLUDING THE SAME

CROSS-REFERENCE TO RELATED APPLICATION

This application claims priority under 35 U.S.C. § 119 to Korean Patent Application No. 10-2016-0032914, filed on Mar. 18, 2016, in the Korean Intellectual Property Office, the disclosure of which is incorporated by reference herein in its entirety.

TECHNICAL FIELD

The present invention relates to an organic light emitting device and a manufacturing method thereof.

DESCRIPTION OF RELATED ART

Organic light-emitting display devices include a plurality of thin film transistors (TFTs) formed using the same process. Some of the TFTs may serve as switching TFTs operating in response to scan signals. Some of the TFTs may serve as driving TFTs to provide a current flow through an organic light emit device.

SUMMARY

According to an exemplary embodiment of the present inventive concept, an organic light emitting display device is provided as follows. A first thin film transistor having a first semiconductor pattern is disposed on a substrate. A second thin film transistor having a second semiconductor pattern is disposed on the substrate. An insulating layer covers the first thin film transistor and the second thin film transistor. At least one first dummy hole passing through the insulating layer overlaps the first semiconductor pattern of the first thin film transistor. At least one second dummy hole passing through the insulating layer overlaps the second semiconductor pattern of the second thin film transistor. Numbers or sizes of the at least one first dummy hole and the at least one second dummy hole are different from each other.

According to an exemplary embodiment of the present inventive concept, a method of manufacturing an organic light emitting device is provided as follows. A first thin film transistor having a first semiconductor pattern and a second thin film transistor having a second semiconductor pattern are formed on a substrate. An insulating layer is formed to cover the first thin film transistor and the second thin film transistor. At least one first dummy hole passing through the insulating layer is formed to overlap the first semiconductor pattern of the first thin film transistor. At least one second dummy hole passing through the insulating layer is formed to overlap the second semiconductor pattern of the second thin film transistor. A heat treatment is performed on the substrate after the forming of the at least one first dummy hole and the at least one second dummy hole. Numbers or sizes of the at least one first dummy hole and at least one second dummy hole are different from each other.

According to an exemplary embodiment of the present inventive concept, an organic light emitting device is provided as follows. A first thin film transistor having a first semiconductor pattern is disposed on a substrate; A first insulating layer covers the first thin film transistor. A second insulating layer covers the first insulating layer. A first contact hole passes through the first insulating layer. A source/drain electrode is in contact with the first semiconductor pattern through the first contact hole. A first dummy hole exposes the first semiconductor pattern. The second insulating layer is in contact with the first semiconductor pattern through the first dummy hole.

BRIEF DESCRIPTION OF DRAWINGS

These and other features of the present invention will become more apparent by describing in detail exemplary embodiments thereof with reference to the accompanying drawings of which.

Figure 1:
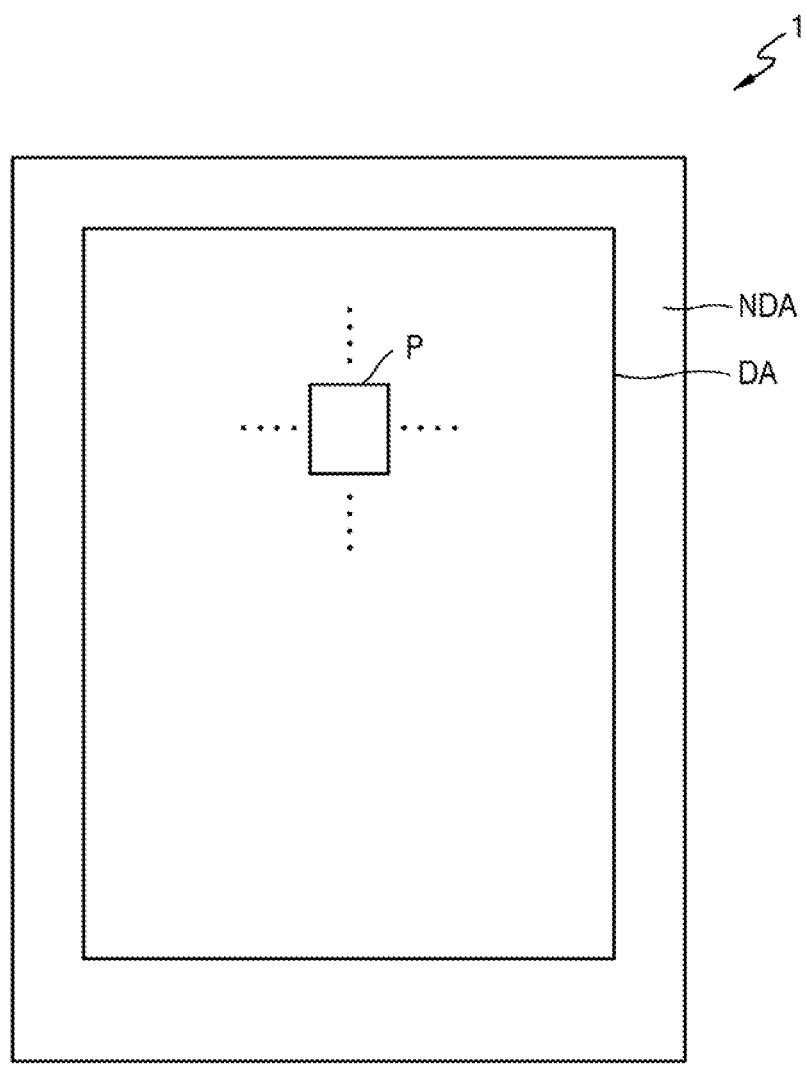
FIG. 1 is a plan view illustrating an organic light-emitting display device according to an exemplary embodiment of the present invention.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a transistor structure) is illustrated in a cross-sectional view, an electronic device may include a plurality of the device structures (e.g., transistor structures), as would be illustrated by a plan view of the electronic device. The plurality of device structures may be arranged in an array and/or in a two-dimensional pattern.

DETAILED DESCRIPTION OF EXEMPLARY EMBODIMENTS

Exemplary embodiments of the present invention will be described below in detail with reference to the accompanying drawings. However, the present invention may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Figure 2:
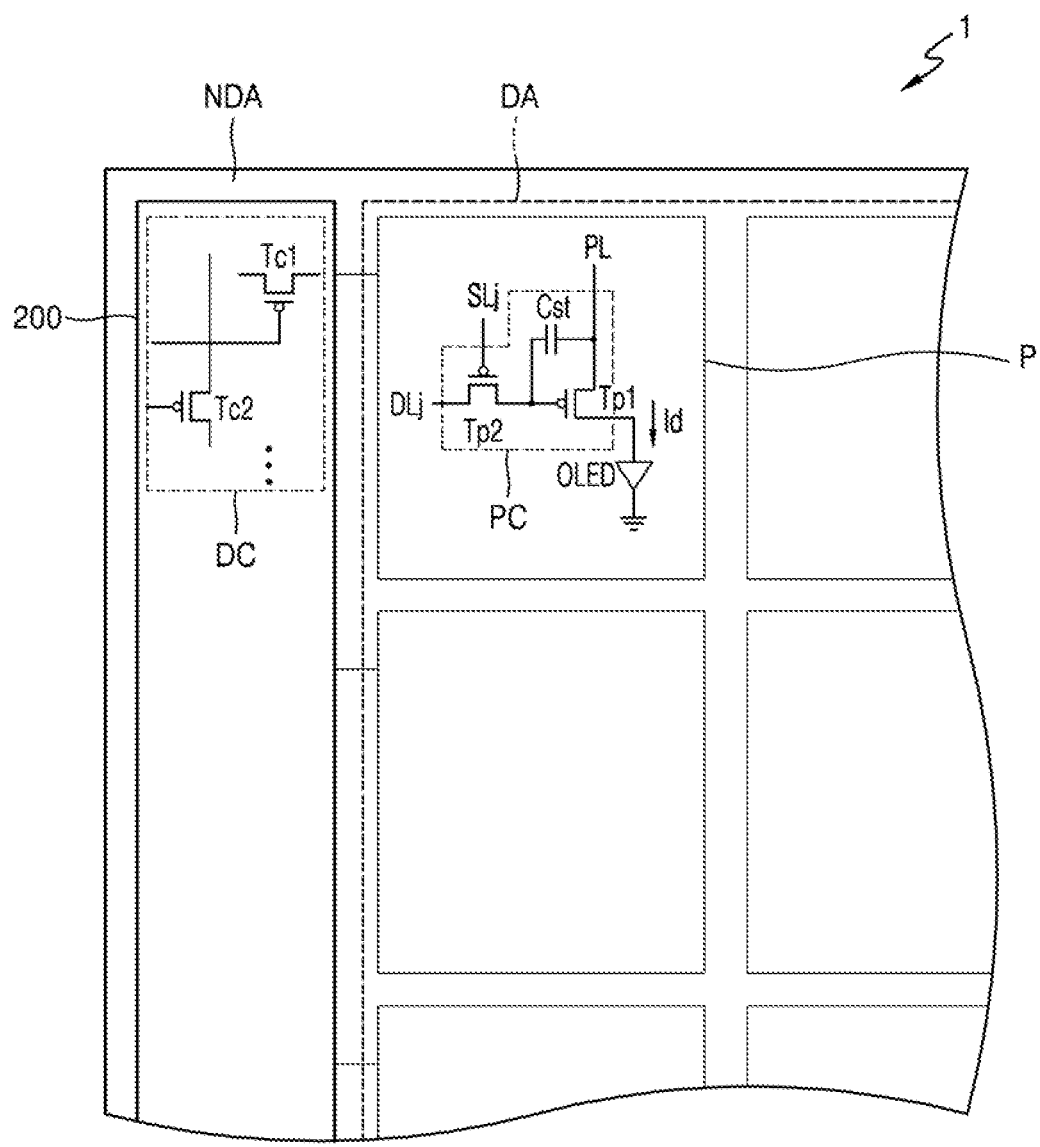
FIG. 2 is a plan view illustrating a portion of the organic light-emitting display device of FIG. 1.
Figure 3:
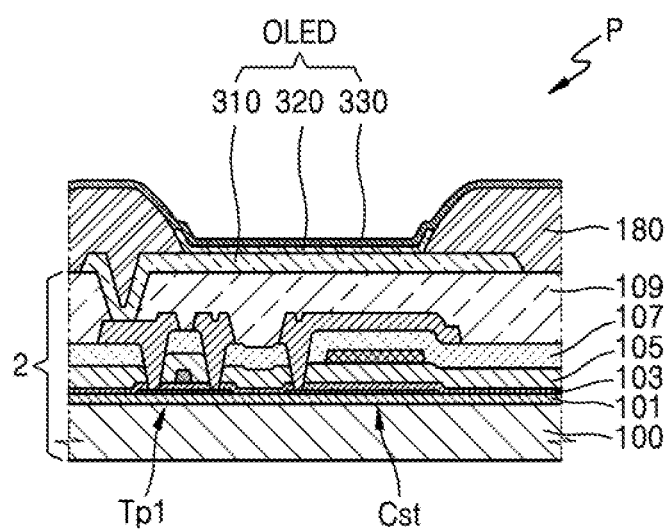
FIG. 3 is a cross-sectional view illustrating one pixel of an organic light-emitting display device.

FIG. 1 is a plan view illustrating an organic light-emitting display device 1 according to an exemplary embodiment of the present invention, FIG. 2 is a plan view illustrating a portion of the organic light-emitting display device 1 of FIG. 1, and FIG. 3 is a cross-sectional view illustrating one pixel of the organic light-emitting display device 1.

Referring to FIGS. 1 and 2, the organic light-emitting display device 1 includes a display area DA (active area) and a non-display area NDA (dead area). The display area DA includes a plurality of pixels P emitting light. Each pixel P may emit red, green, and blue light, but the present invention is not limited thereto.

The display area DA includes pixel regions PA. A pixel circuit PC and an organic light-emitting diode (OLED), which is a display element, are disposed in each pixel region PA. The pixel circuit PC may include at least two thin film transistors (TFTs) and at least one storage capacitor. The pixel circuit PC includes a switching TFT Tp2, a driving TFT Tp1, a storage capacitor Cst, and an OLED.

The switching TFT Tp2 is connected to a scan signal line SLj and a data line DLj. The switching TFT Tp2 transfers a data voltage input from the data line DLj to the driving TFT Tp1 depending on a switching voltage input from the scan signal line SLj.

The storage capacitor Cst is connected to the switching TFT Tp2 and a power line PL, and stores a voltage corresponding to a difference between a voltage transmitted from the switching TFT Tp2 and a voltage ELVDD supplied to the power line PL.

The driving TFT Tp1 is connected to the power line PL and the storage capacitor Cst, and may control a driving current Id flowing through the OLED from the driving power line PL in response to a voltage value stored in the storage capacitor Cst. The OLED may emit light having predetermined brightness by using the driving current Id.

Referring to FIG. 3, the pixel P of FIG. 1 includes an OLED disposed on a TFT substrate 2 including a pixel circuit PC. The OLED includes a pixel electrode 310, an intermediate layer 320 including an organic emission layer, and an opposite electrode 330 facing the pixel electrode 310 with the intermediate layer 320 disposed therebetween.

The TFT substrate 2 includes a driving TFT Tp1 disposed on a substrate 100, a switching TFT Tp2 (not shown in FIG. 3) electrically connected with the driving TFT Tp1, and a storage capacitor Cst, and includes sequentially stacked insulating layers on the substrate 100.

In FIG. 3, the TFT substrate 2 denotes a structure including the substrate 100 below the pixel electrode 310. For example, the TFT substrate may include a TFT on the substrate 100. For example, the TFT substrate may further include the insulating layer located below the pixel electrode 310. For example, the TFT substrate may further include a pixel-defining layer 180 covering an end of the pixel electrode 310.

Referring back to FIGS. 1 and 2, the non-display area NDA may surround the display area DA, and may include a driver 200 for transferring a predetermined signal to a plurality of pixels P provided to the display area DA. In an exemplary embodiment, the driver 200 may be a scan driver.

A driver circuit DC located in the non-display area NDA may include a plurality of TFTs Tc1 and Tc2. The plurality of TFTs Tc1 and Tc2 may be electrically connected with wirings or different devices and may transfer a scan signal to each pixel.

Figure 4A:
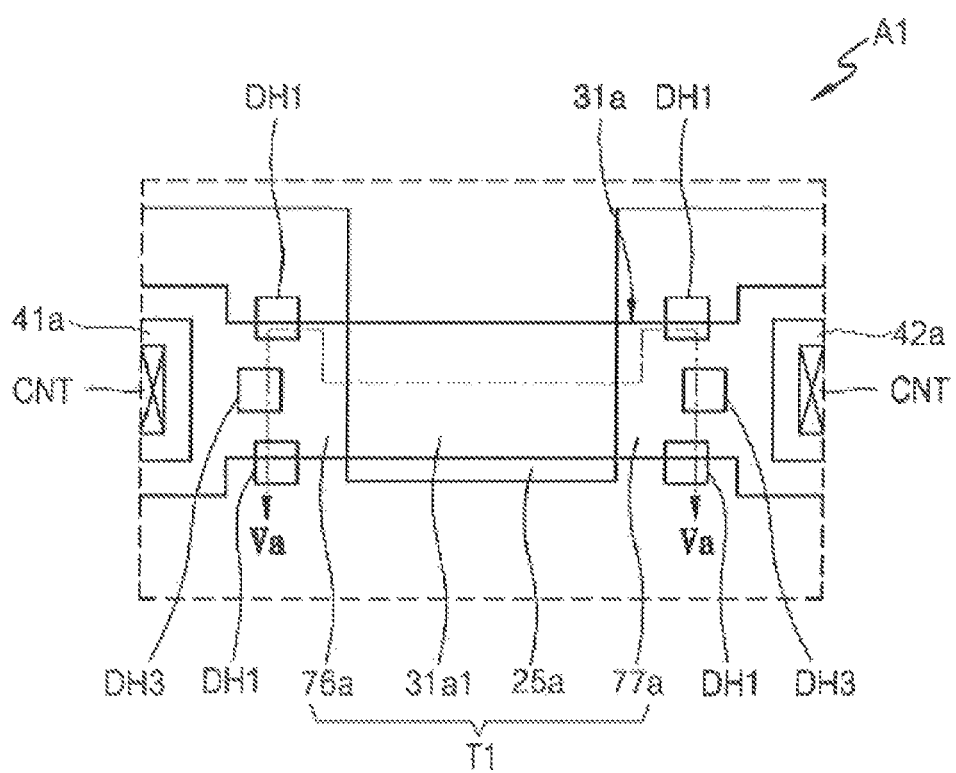
FIGS. 4A and 4B are plan views respectively illustrating a first thin film transistor (TFT) and a second TFT of an organic light-emitting display device according to an exemplary embodiment of the present invention.
Figure 4B:
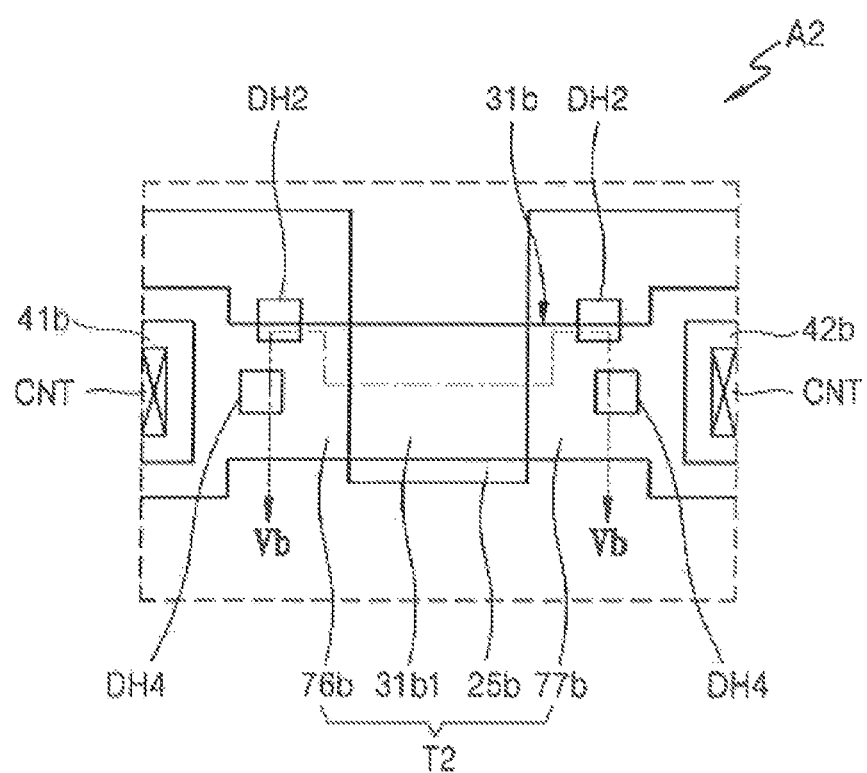
Figure 5:
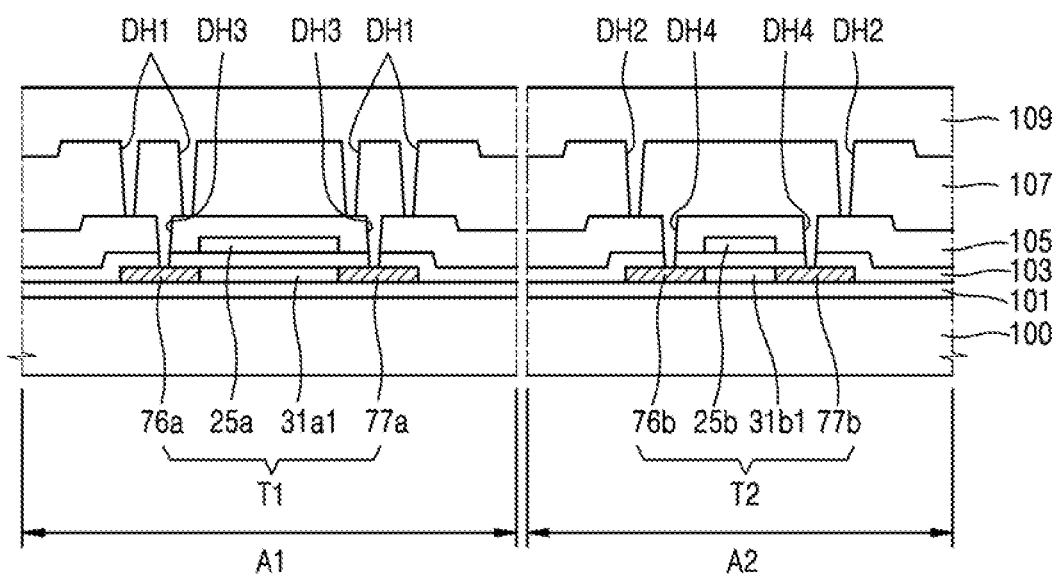
FIG. 5 is a cross-sectional view taken along a line Va-Va and a line Vb-Vb of FIGS. 4A and 4B.
Figure 6:
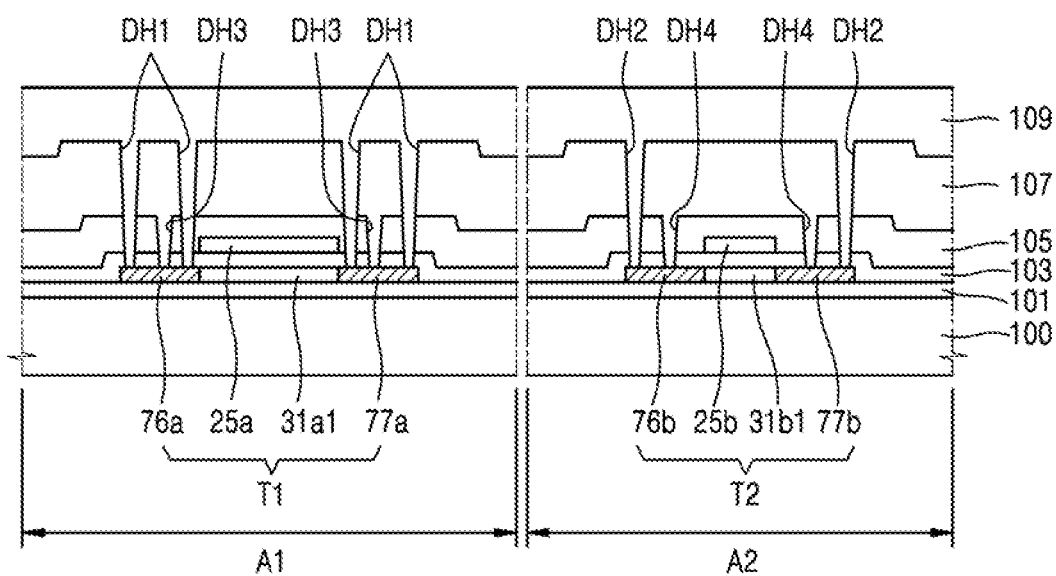
FIG. 6 is a cross-sectional view illustrating a modified embodiment of FIG. 5.
Figure 7A:
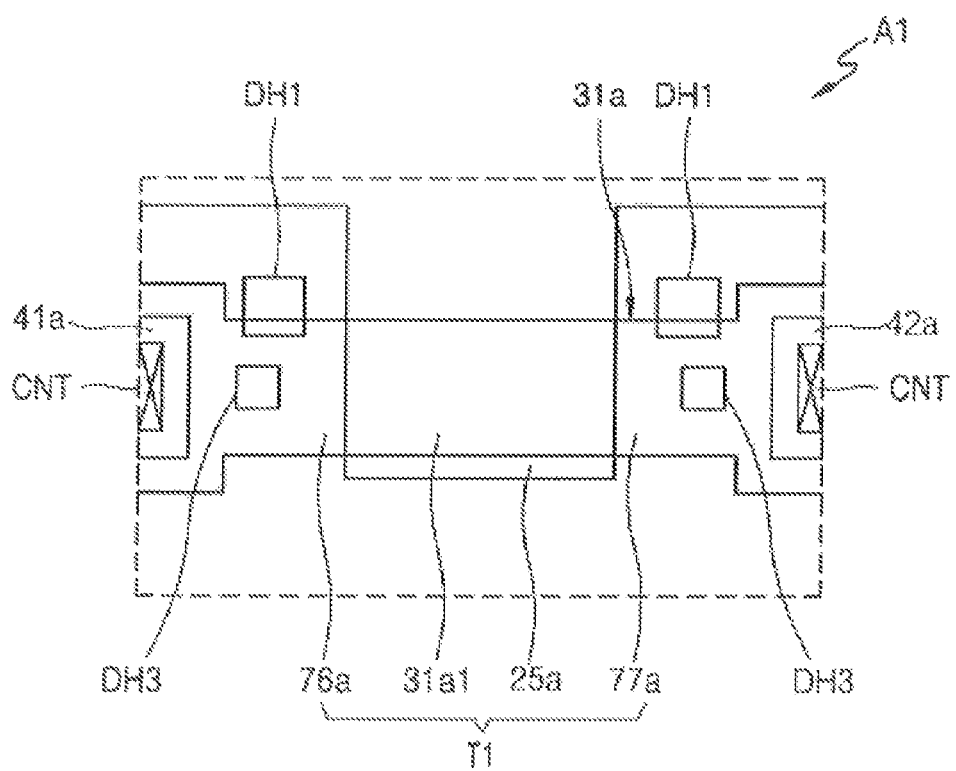
FIGS. 7A and 7B are plan views respectively illustrating a first region and a second region of an organic light-emitting display device according to an exemplary embodiment of the present invention.
Figure 7B:
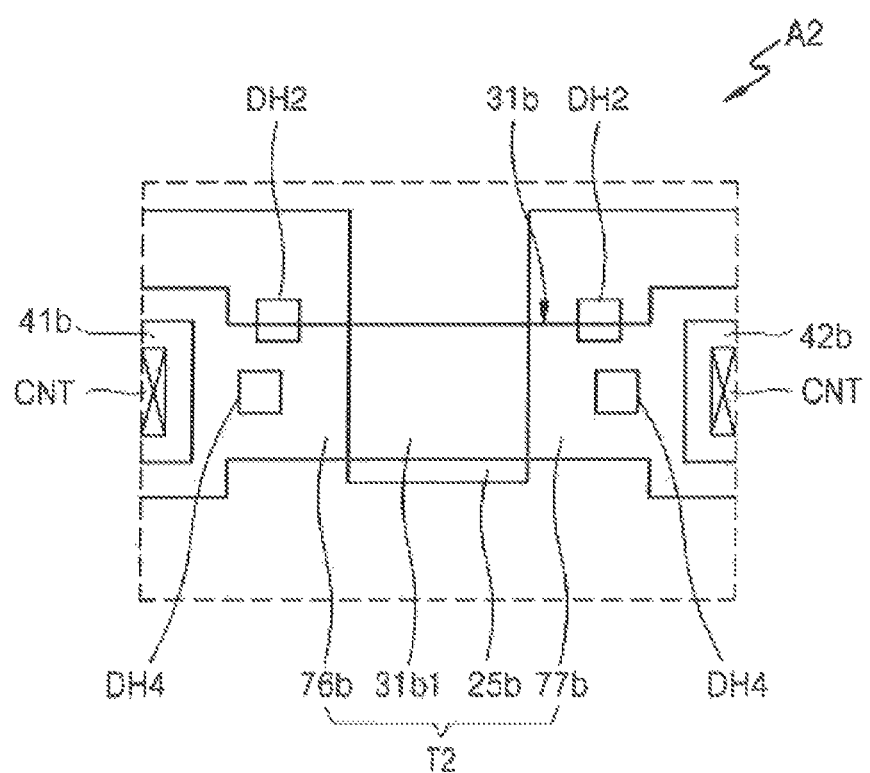

FIGS. 4A and 4B are plan views respectively illustrating a first TFT and a second TFT of an organic light-emitting display device according to an exemplary embodiment of the present invention. FIG. 5 is a cross-sectional view taken along a line Va-Va and a line Vb-Vb of FIGS. 4A and 4B, FIG. 6 is a cross-sectional view illustrating a modified embodiment of FIG. 5, and FIGS. 7A and 7B are plan views respectively illustrating a first region and a second region of an organic light-emitting display device according to another embodiment. For convenience of description, FIG. 5 omits layers above a protection layer 109 in an organic light-emitting display device according to an exemplary embodiment of the present invention.

Referring to FIGS. 4A and 4B, a first TFT T1 is disposed in a first region A1 of an organic light-emitting display device, and a second TFT T2 is disposed in a second region A2 of the organic light-emitting display device. The first TFT T1 includes a first semiconductor pattern 31a including a first channel region 31a1, a first source region 76a and a first drain region 77a disposed at both sides of the first channel region 31a1, and a first gate electrode 25a. The second TFT T2 includes a second semiconductor pattern 31b including a second channel region 31b1, a second source region 76b and a second drain region 77b disposed at both sides of the second channel region 31b1, and a second gate electrode 25b.

An insulating layer covers the first TFT T1 and the second TFT T2. The first TFT T1 and the second TFT T2 may have different characteristics via a dummy hole passing through the insulating layer. Hereinafter, for convenience of description, description is made according to a stacking sequence with reference to FIGS. 4A, 4B and 5.

Referring to FIGS. 4A, 4B and 5, the substrate 100 may include a glass material, a metallic material, or a plastic material such as polyethylene terephthalate (PET), polyethylene naphthalate (PEN), and polyimide.

A buffer layer 101 may be disposed on the substrate 100, and may include an oxide layer such as SiOx and/or a nitride layer such as SiNx.

The first and second semiconductor patterns 31a and 31b are disposed on the buffer layer 101. The first and second semiconductor patterns 31a and 31b include polycrystalline silicon. The first semiconductor pattern 31a includes the first channel region 31a1, the first source region 76a and the first drain region 77a doped with impurities of higher concentration than that of the first channel region 31a1. The second semiconductor pattern 31b includes the second channel region 31b1, the second source region 76b and the second drain region 77b doped with impurities of higher concentration than that of the second channel region 31b1. The impurities may change depending on a kind of a TFT, and N-type impurities or P-type impurities may be used.

A gate insulating layer 103 is disposed on the first and second semiconductor patterns 31a and 31b. The gate insulating layer 103 may include a single-layered or multi-layered thin film including an inorganic material including an oxide layer such as SiOx and/or a nitride layer such as SiNx, or an organic material. Though FIG. 5 illustrates a case where the gate insulating layer 103 entirely covers the substrate 100, the present invention is not limited thereto. For example, the gate insulating layer 103 may have the same pattern as patterns of the first and second gate electrodes 25a and 25b depending on a patterning process.

The first and second gate electrodes 25a and 25b overlap the first and second channel regions 31a1 and 31b1, respectively, with the gate insulating layer 103 disposed therebetween. The first and second gate electrodes 25a and 25b may include a metallic material such as Al and Cu, but the present invention is not limited thereto.

An insulating layer (a second insulating layer 107 covers the first and second TFTs T1 and T2 on the substrate 100. The insulating layer 107 may include an inorganic material including an oxide layer such as SiOx, an oxynitride layer such as SiON, and/or a nitride layer such as SiNx. The present invention is not limited thereto. For example, the insulating layer 107 may include an acryl-based organic material or an organic insulating layer such as benzocyclobutene (BCB).

A first dummy hole DH1 and a second dummy hole DH2 pass through the insulating layer 107. The first dummy hole DH1 is adjacent to the first TFT T1, and the second dummy hole DH2 is adjacent to the second TFT T2.

The number of first dummy holes DH1 and the number of second dummy holes DH2 are different from each other. In an exemplary embodiment, the number of first dummy holes DH1 is greater than the number of second dummy holes DH2.

The first and second dummy holes DH1 and DH2 may adjust characteristics of the first and second TFTs T1 and T2. Hydrogen ions exist at the interfaces between the gate insulating layer 103 and the first semiconductor pattern 31a and between the gate insulating layer 103 and the second semiconductor patterns 31b. The hydrogen ions may evaporate via the first and second dummy holes DH1 and DH2 in the manufacturing of the first and second TFTs T1 and T2 are manufactured.

When the number of first dummy holes DH1 is greater than the number of second dummy holes DH2, larger amount of hydrogen ions evaporate via the first dummy hole DH1 than the second dummy holes DH2, so that the mobility of the first TFT T1 becomes less than the mobility of the second TFT T2. Therefore, the characteristics of the first and second TFTs T1 and T2 may be adjusted by differing the numbers of first and second dummy holes DH1 and DH2 as described above.

An interlayer insulating layer (a first insulating layer) 105 is disposed between the first TFT T1 and the insulating layer 107 and the second TFT T2 and the insulating layer 107. Contact holes CNT connecting the first and second source regions 76a and 76b and the first and second drain regions 77a and 77b of the first and second TFTs T1 and T2 with wirings 41a, 41b, 42a, 42b, respectively, may be located in the interlayer insulating layer 105.

The interlayer insulating layer 105 may include a third dummy hole DH3 and a fourth dummy hole DH4. For example, the third and fourth dummy holes DH3 and DH4 may penetrate the interlayer insulating layer 105.

The third and fourth dummy holes DH3 and DH4 may expose the first and second semiconductor patterns 31a and 31b respectively, and evaporate hydrogen contained in the first and second semiconductor patterns 31a and 31b in the manufacturing of the first and second TFTs T1 and T2.

The interlayer insulating layer 105 may include an inorganic material including an oxide layer such as SiOx, an oxynitride layer such as SiON, or a nitride layer such as SiNx, and include a single layer or a multi-layer.

The protection layer (a third insulating layer) 109 may be disposed on the insulating layer 107. The protection layer 109 may serve to protect the first and second TFTs T1 and T2. The protection layer 109 may also serve as a planarization layer having a flat upper surface. The protection layer 109 may include an acryl-based organic material or an organic insulating layer such as benzocyclobutene (BCB). A portion of the protection layer 109 fills the first and second dummy holes DH1 and DH2.

The first and second dummy holes DH1 and DH2 may overlap the third and fourth dummy holes DH3 and DH4. The present invention is not limited thereto. For example, as shown in FIG. 5, the first and second dummy holes DH1 and DH2 need not overlap each other. In this case, hydrogen of the first and second semiconductor patterns 31a and 31b may pass through the interlayer insulating layer 105 through diffusion and evaporate via the first and second dummy holes DH1 and DH2.

In FIG. 6, the first and second dummy holes DH1 and DH2 may extend toward the substrate 100 and pass through the interlayer insulating layer 105, the insulating layer 107 and the gate insulating layer 103. In this case, the first and second dummy holes DH1 and DH2 may extend up to the first and second semiconductor patterns 31a and 31b depending on the locations of the first and second dummy holes DH1 and DH2.

According to an exemplary embodiment described with reference to FIGS. 4A and 4B, the number of first dummy holes DH1 and the number of second dummy holes DH2 are different from each other. The present invention is not limited thereto.

In an exemplary embodiment, as illustrated in FIGS. 7A and 7B, the size of the first dummy hole DH1 and the size of the second dummy hole DH2 may be different from each other. Since evaporation of hydrogen is actively performed via the large-sized first dummy hole DH1 compared to the relatively small-sized second dummy hole DH2, the characteristics of the first and second TFTs T1 and T2 may be controlled differently.

The controlling of the characteristics of the first and second TFTs T1 and T2 using the first and second dummy holes DH1 and DH2 is described below with reference to FIGS. 8A to 8C.

Figure 8A:
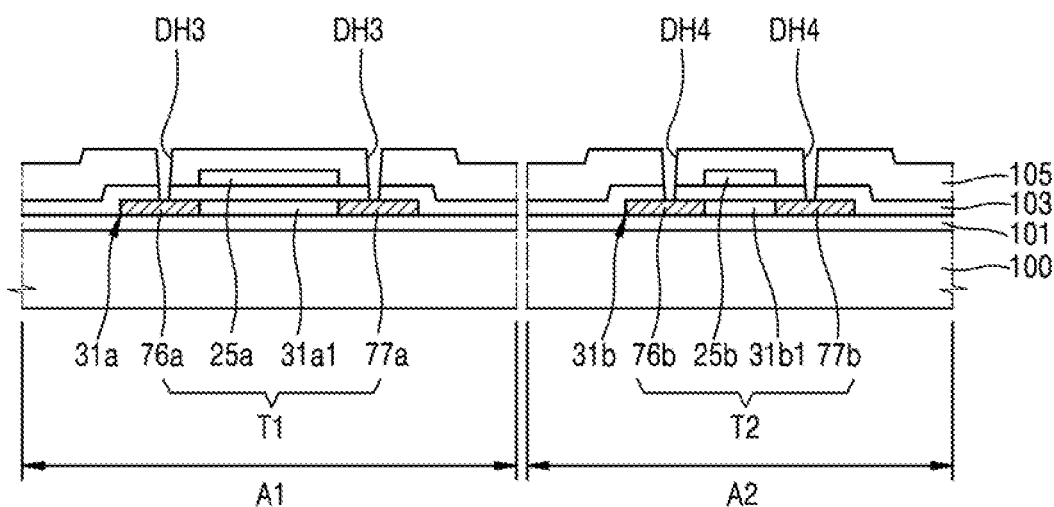
FIGS. 8A to 8C are cross-sectional views illustrating a process of manufacturing an organic light-emitting display device according to an exemplary embodiment of the present invention.
Figure 8B:
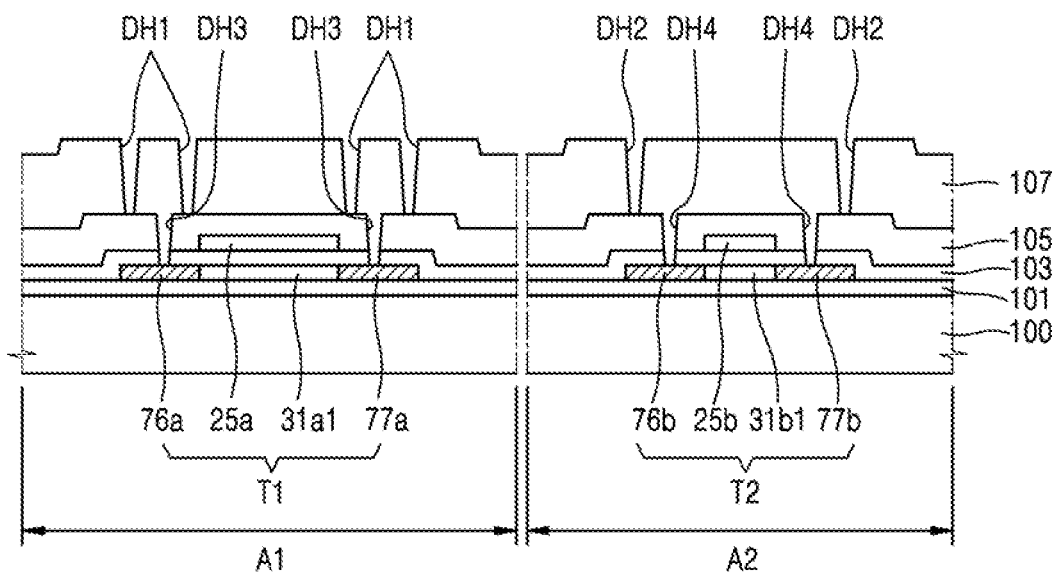
Figure 8C:
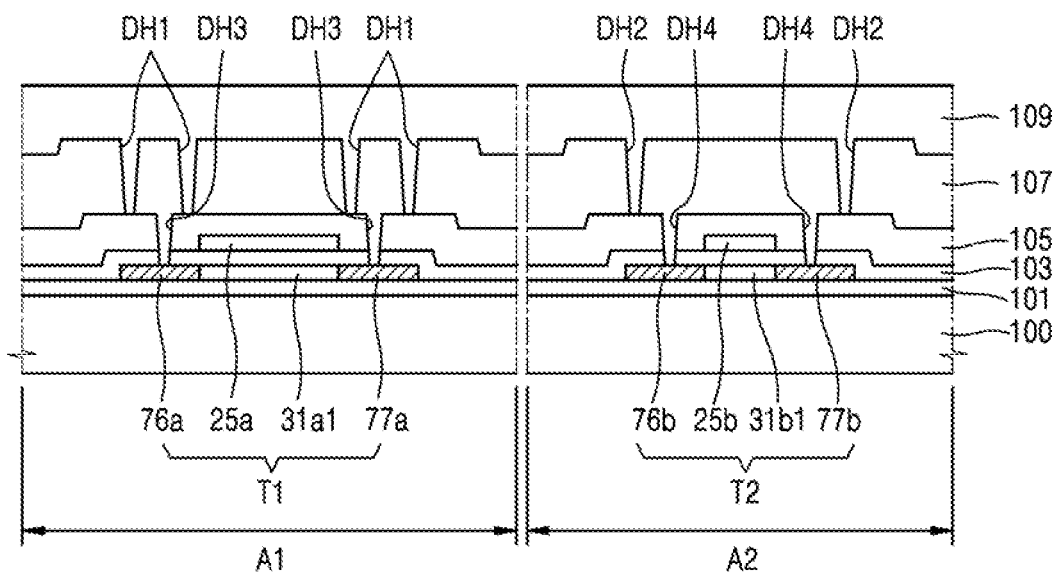

FIGS. 8A to 8C are cross-sectional views illustrating a process of manufacturing an organic light-emitting display device according to an exemplary embodiment.

Referring to FIG. 8A, the first and second TFTs T1 and T2 are formed on the substrate 100.

The buffer layer 101 is formed on the substrate 100, and the first semiconductor pattern 31a located in the first region A1 of the substrate 100 and the second semiconductor pattern 31b located in the second region A2 of the substrate 100 are formed by forming a semiconductor layer (not shown) on the buffer layer 101 and patterning the semiconductor layer. The substrate 100 and the buffer layer 101 may include the above-described material. The buffer layer 101 may be omitted depending on a material forming the substrate 100 and a process.

The first and second semiconductor patterns 31a and 31b may include polysilicon. According to an exemplary embodiment, the polysilicon may be formed by crystallizing amorphous silicon. Various crystallizing methods such as a rapid thermal annealing (RTA) method, a solid phase crystallization (SPC) method, an excimer laser annealing (ELA) method, a metal induced crystallization (MIC) method, a metal induced lateral crystallization (MICL) method, or a sequential lateral solidification (SLS) method may be used.

The gate insulating layer 103 is formed on the first and second semiconductor patterns 31a and 31b. Also, the first and second gate electrodes 25a and 25b are formed by forming a metallic layer (not shown) on the gate insulating layer 103 and patterning the metallic layer. The gate insulating layer 103 may include a single-layered or multi-layered thin film including an inorganic material including an oxide layer such as SiOx or a nitride layer such as SiNx, or an organic material. The gate insulating layer 103 may be formed by using a deposition method such as a plasma-enhanced chemical vapor deposition (PECVD) method, an atmospheric pressure CVD (APCVD) method, and a low pressure CVD (LPCVD) method. The first and second gate electrodes 25a and 25b may include a metallic material such as Al and Cu, and include a single layer or a multi-layer.

The first and second source regions 76a and 76b and the first and second drain regions 77a and 77b are formed by doping the first and second semiconductor patterns 31a and 31b with impurities. In this case, the first and second gate electrodes 25a and 25b may serve as a self-aligned mask for forming the source regions 76a and 76b and the drain regions 77a and 77b.

The interlayer insulating layer 105 is formed to cover the first and second gate electrodes 25a and 25b. The interlayer insulating layer 105 may include an inorganic material including an oxide layer such as SiOx, an oxynitride layer such as SiON, or a nitride layer such as SiNx, and include a single layer or a multi-layer.

Though not shown, contact holes CNT (see FIGS. 4A and 4B) for electric connection between wirings 41a, 41b, 42a, and 42b and the first and second TFTs T1 and T2 are formed in the interlayer insulating layer 105.

The third and fourth dummy holes DH3 and DH4 may be formed in the interlayer insulating layer 105. For example, the third and fourth dummy holes DH3 and DH4 may penetrate the interlayer insulating layer 105 and the gate insulating layer 103 to expose the first source region 76a and the first drain region 77a. A first annealing process, for example, a heat-treatment process, may be applied to the resulting structure of FIG. 8A to evaporate hydrogen contained in the first and second semiconductor patterns 31a and 31b via the third and fourth dummy holes DH3 and DH4.

Referring to FIG. 8B, the insulating layer 107 is formed on the interlayer insulating layer 105. The insulating layer 107 may include an inorganic material including an oxide layer such as SiOx, an oxynitride layer such as SiON, or a nitride layer such as SiNx. The present invention is not limited thereto. For example, the insulating layer 107 may include an acryl-based organic material or an organic insulating layer such as BCB. The insulating layer 107 may include a single layer or a multi-layer including the above-described materials.

The first and second dummy holes DH1 and DH2 are formed in the insulating layer 107. For example, the first and second dummy holes DH1 and DH2 may penetrate the insulating layer 107 to expose the interlayer insulating layer 105. The number of first dummy holes DH1 and the number of second dummy holes DH2 are different from each other. For example, the number of first dummy holes DH1 may be greater than the number of second dummy holes DH2.

After the formation of the first and second dummy holes DH1 and DH2 in the insulating layer 107, a second annealing process (heat-treatment process) is performed on the resulting structure of FIG. 8B to evaporate hydrogen ions from the first and second semiconductor patterns 31a and 31b via the first and second dummy holes DH1 and DH2. Since the number of first dummy holes DH1 is greater than the number of second dummy holes DH2, a relatively large amount of hydrogen evaporates via the first dummy holes DH1, so that mobility of the first TFT T1 becomes less than mobility of the second TFT T2. For example, the first TFT T1 and the second TFT T2 have different characteristics when the first and second TFT T1 and T2 are formed using the same process.

Referring to FIG. 8C, the protection layer 109 is formed on the insulating layer 107. The protection layer 109 may include an acryl-based organic material or an organic insulating layer such as benzocyclobutene (BCB).

According to an exemplary embodiment, the first and second TFTs T1 and T2 are formed via the same process, but may have different characteristics by differing the numbers or the sizes of the first and second dummy holes DH1 and DH2.

In an exemplary embodiment, the numbers and the sizes of third and fourth dummy holes DH3 and DH4 passing through the interlayer insulating layer 105 may be different from each other to control the characteristics of the first and second TFTs T1 and T2. For example, the characteristics of the first and second transistors TFTs T1 and T2 may be independently controlled using the same process to form the first and second transistors TFTs T1 and T2 by differing the numbers and the sizes of the first and second dummy holes DH1 and DH2 or the numbers and the sizes of the third and fourth dummy holes DH3 and DH4.

In an exemplary embodiment, FIGS. 8A to 8C describe a process of manufacturing a TFT substrate of an organic light-emitting display device corresponding to FIGS. 4A and 4B. The present invention is not limited thereto. The TFT substrate of the organic light-emitting display device described with reference to FIGS. 6, 7A, and 7B is also manufactured according to a process similar to the process described with reference to FIGS. 8A to 8C with the only difference being in differing the depths of the first and second dummy holes DH1 and DH2 or differing the sizes of the first and second dummy holes DH1 and DH2 instead of the numbers of first and second dummy holes DH1 and DH2.

Figure 9:
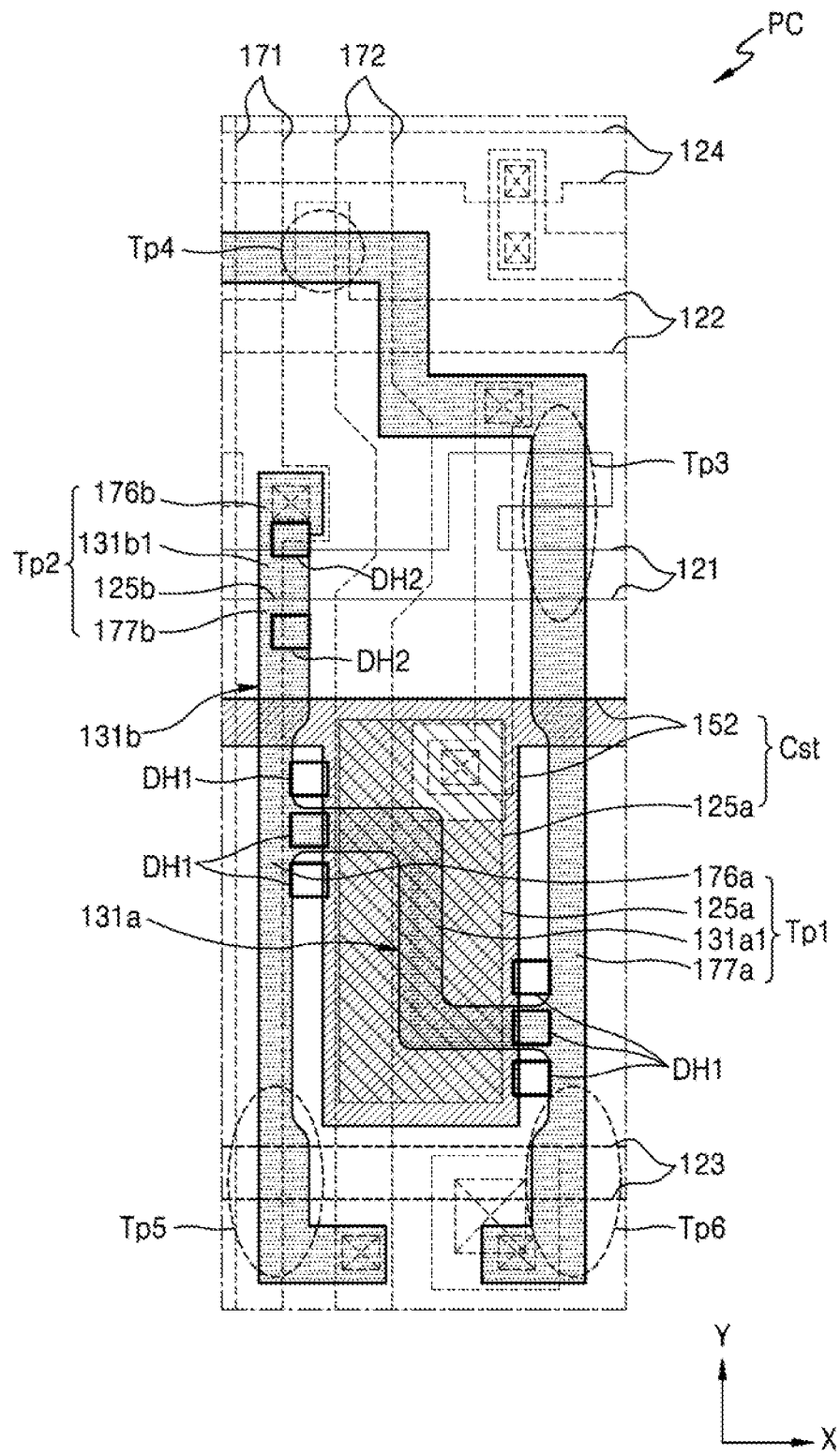
FIGS. 9 and 10 are plan views illustrating a pixel circuit of an organic light-emitting display device according to an exemplary embodiment of the present invention.
Figure 10:
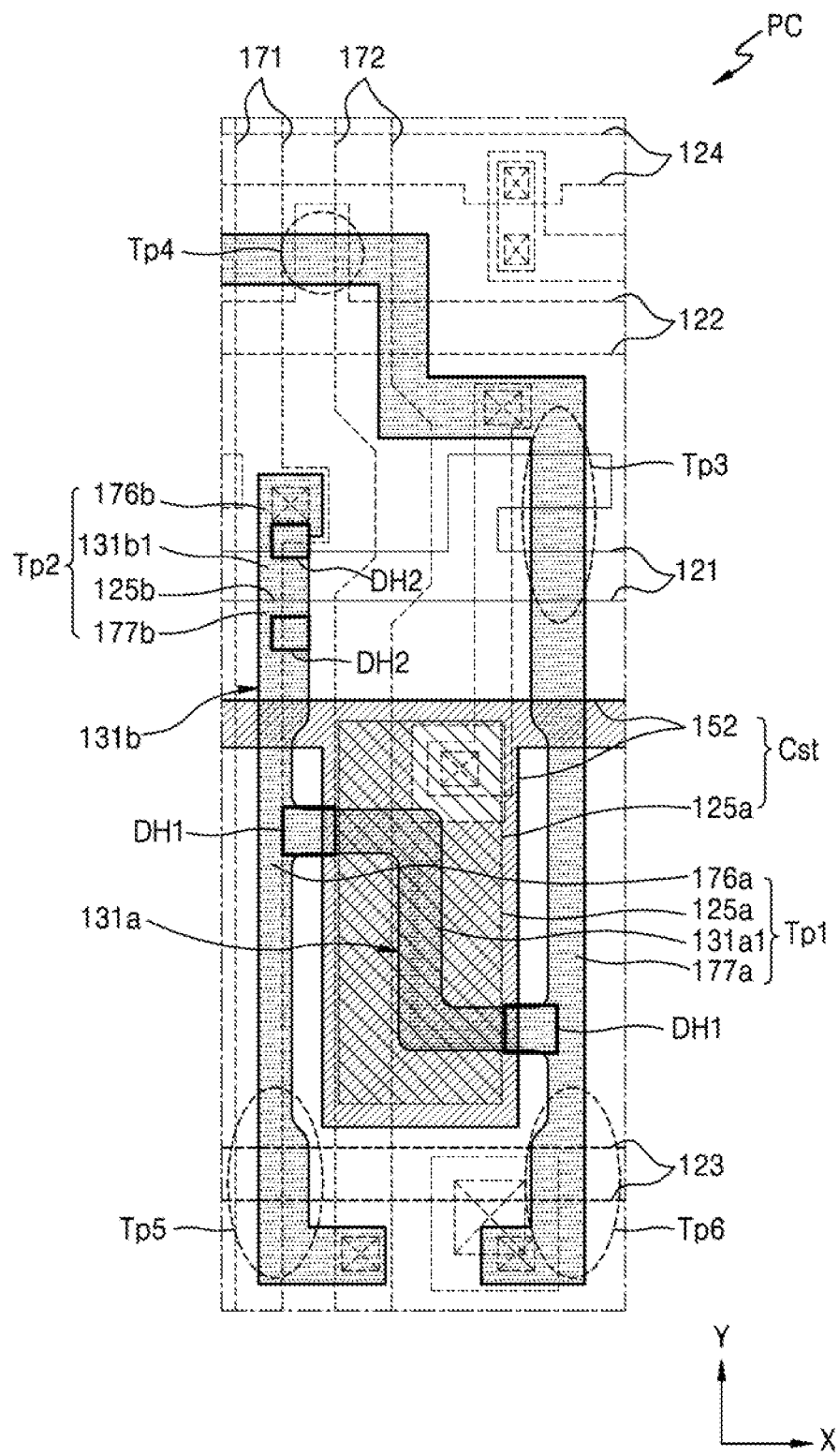

FIGS. 9 and 10 are plan views illustrating a pixel circuit of an organic light-emitting display device according to an exemplary embodiment.

Referring to FIG. 9, a pixel P includes a scan signal line 121, a previous scan signal line 122, an emission control line 123, and an initialization voltage line 124 extending along an X-direction, and a data line 171 and a driving power line 172 extending along a Y-axis direction.

The pixel P may further include a driving TFT Tp1, a switching TFT Tp2, a compensation TFT Tp3, an initialization TFT Tp4, an operation control TFT Tp5, an emission control TFT Tp6, and a storage capacitor Cst.

A driving semiconductor pattern 131a includes a driving channel region 131a1, a driving source region 176a and a driving drain region 177a located at both sides of the driving channel region 131a1 and including impurities of higher concentration than that of the driving channel region 131a1. The driving channel region 131a1 overlaps a driving gate electrode 125a. A gate insulating layer is disposed between the driving channel region 131a1 and the driving gate electrode 125a.

A switching semiconductor pattern 131b includes a switching channel region 131b1, a switching source region 176b and a switching drain region 177b located at both sides of the switching channel region 131b1 and including impurities of higher concentration than that of the switching channel region 131b1. The switching channel region 131b1 overlaps a switching gate electrode 125b. A gate insulating layer is disposed between the switching channel region 131b1 and the switching gate electrode 125b. In an exemplary embodiment, the gate insulating layer of the driving TFT Tp1 and the gate insulating layer of the switching TFT Tp2 may be formed using the same process, and may be formed of the same material.

A channel length of the driving channel region 131a1 may be greater than that of the switching channel region 131b1. For example, a long channel length may be formed in a narrow space by bending the driving semiconductor pattern 131a to include a plurality of bent portions having shapes such as an alphabet L or S, or Ω.

The storage capacitor Cst may be disposed to overlap the driving TFT Tp1. A sufficient storage capacitance may be secured at even a high resolution by forming the storage capacitor Cst to overlap the driving TFT Tp1.

The storage capacitor Cst includes a first electrode 125a and a second electrode 152 overlapping each other with a dielectric insulating layer disposed therebetween. The first electrode 125a also serves as a driving gate electrode of the driving TFT Tp1. For example, the driving channel region 131a1 is a portion of the driving semiconductor pattern 131 which overlaps the first electrode 125a.

The driving TFT Tp1 and the switching TFT Tp2 are covered with an insulating layer, and have different characteristics due to the first dummy hole DH1 and the second dummy hole DH2 penetrating the insulating layer.

For example, the number of first dummy holes DH1 adjacent to the driving TFT Tp1 is greater than the number of second dummy holes DH2 adjacent to the switching TFT Tp2. Therefore, hydrogen ions contained in the driving semiconductor pattern 131a may evaporate more than hydrogen ions contained in the switching semiconductor pattern 131b, so that the driving TFT Tp1 and the switching TFT Tp2 have different characteristics as described with reference to FIGS. 4A to 8C.

Since hydrogen ions of the driving TFT Tp1, like the first TFT T1, evaporate much, mobility reduces and an I—V curve has a gentle slope before a threshold voltage. That is, a driving (DR) range increases and thus abundant gray scales may be expressed. In contrast, since hydrogen ions of the switching TFT Tp2, like the second TFT T2, evaporate less, the switching TFT Tp2 has a good on/off characteristic and thus may have a characteristic advantageous to a high speed operation.

In FIG. 9, the numbers of first and second dummy holes DH1 and DH2 are different to control the characteristics of the driving TFT Tp1 and the switching TFT Tp2 independently using the same process. The present invention is not limited thereto. For example, as illustrated in FIG. 10, the sizes of the first and second dummy holes DH1 and DH2 are different to control the characteristics of the driving TFT Tp1 and the switching TFT Tp2 independently using the same process.

Figure 11:
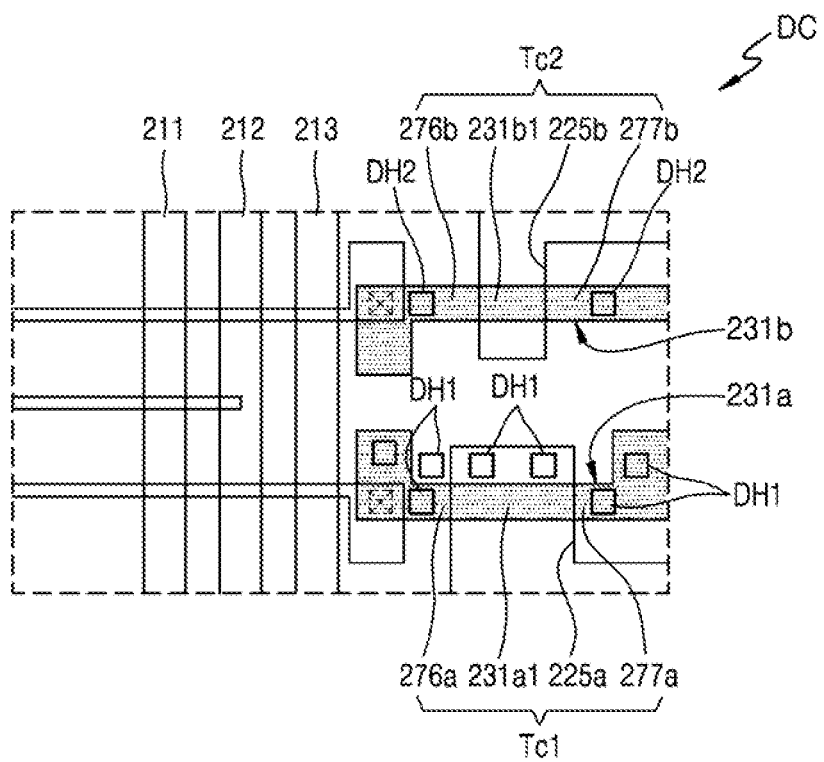
FIGS. 11 and 12 are plan views illustrating a driver circuit located in a non-display area of an organic light-emitting display device according to an exemplary embodiment of the present invention.
Figure 12:
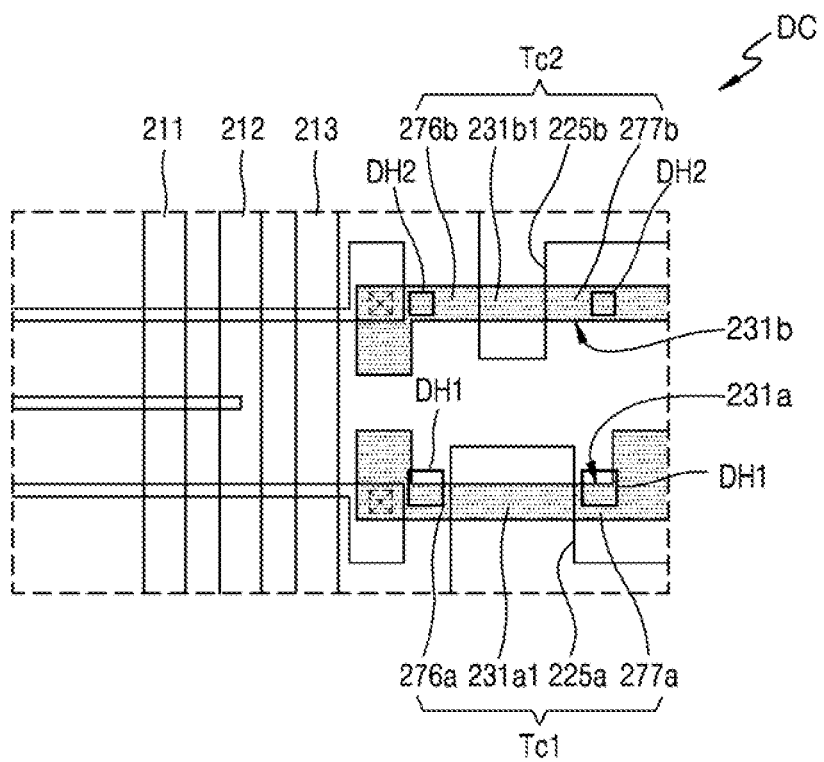

FIGS. 11 and 12 are plan views illustrating a driver circuit DC located in a non-display area of an organic light-emitting display device according to an exemplary embodiment.

Referring to FIG. 11, the driver circuit DC is located in a non-display area NDA (see FIG. 2), and includes wirings 211, 212, and 213, and TFTs Tc1 and Tc2 connected to the wirings. Hereinafter, for convenience of description, one of the TFTs Tc1 and Tc2 is referred to as a TFT Tc1 for a first driver circuit, and the other is referred to as a TFT Tc2 for a second driver circuit.

A semiconductor pattern 231a of the TFT Tc1 for the first driver circuit includes a channel region 231a1, a source region 276a and a drain region 277a located at both sides of the channel region 231a1 and including impurities of higher concentration than that of the channel region 231a1. The channel region 231a1 overlaps a gate electrode 225a. A gate insulating layer may be disposed between the channel region 231a1 and the gate electrode 225a.

A semiconductor pattern 231b of the TFT Tc2 for the second driver circuit includes a channel region 231b1, a source region 276b and a drain region 277b located at both sides of the channel region 231b1 and including impurities of higher concentration than that of the channel region 231b1. The channel region 231b1 overlaps a gate electrode 225b. A gate insulating layer may be disposed between the channel region 231b1 and the gate electrode 225b. In an exemplary embodiment, the gate insulating layer of the first driver circuit and the gate insulating layer of the second driver circuit may be formed using the same process.

An insulating layer covers the TFTs Tc1 and Tc2 for the first and second driver circuits, and the number of first dummy holes DH1 and the number of second dummy holes DH2 provided to the insulating layer are different from each other.

As an area occupied by a display area DA increases and an area occupied by a non-display area NDA gradually reduces in the organic light-emitting display device 1 (see FIG. 1), design of the driver circuit DC is complicated, and some of TFTs reduce in their size, and functionally different characteristics of the TFTs are required. Therefore, as illustrated in FIG. 11, the TFT Tc1 for the first driver circuit and the TFT Tc2 for the second driver circuit may have different characteristics by differing the number of first dummy holes DH1 adjacent to the TFT Tc1 for the first driver circuit from the number of second dummy holes DH2 adjacent to the TFT Tc2 for the second driver circuit.

In an exemplary embodiment, the number of first dummy holes DH1 may be greater than the number of second dummy holes DH2. Therefore, the large amount of hydrogen ions contained in the semiconductor pattern 231a of the TFT Tc1 for the first driver circuit evaporate like those contained in the first TFT T1, but the small amount of hydrogen ions contained in the semiconductor pattern 231b of the TFT Tc2 for the second driver circuit evaporate like those contained in the second TFT T2. Since the amounts of evaporated hydrogen ions are different, the TFTs Tc1 and Tc2 for the first and second driver circuits which are manufactured using the same process have different characteristics, as described with reference to FIGS. 4A to 8C.

In FIG. 11, the number of first dummy holes DH1 is different from the number of second dummy holes DH2. The present invention is not limited thereto. For example, as illustrated in FIG. 12, the TFTs Tc1 and Tc2 for the first and second driver circuits may have different characteristics by differing the sizes of the first and second dummy holes DH1 and DH2 in the manufacturing of the TFTs Tc1 and Tc2 for the first and second driver circuits using the same process.

FIGS. 13A and 13B, 14A and 14B are plan views illustrating a pixel circuit PC located in a display area and a driver circuit DC located in a non-display area of an organic light-emitting display device according to an exemplary embodiment.

Figure 13A:
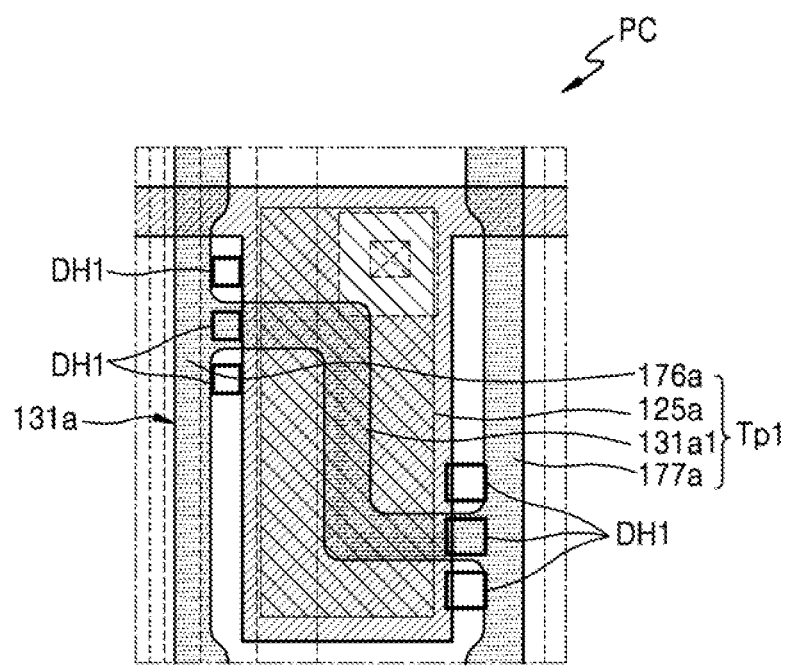
FIGS. 13A and 13B are plan views illustrating a pixel circuit located in a display area and a driver circuit located in a non-display area of an organic light-emitting display device according to an exemplary embodiment of the present invention.
Figure 13B:
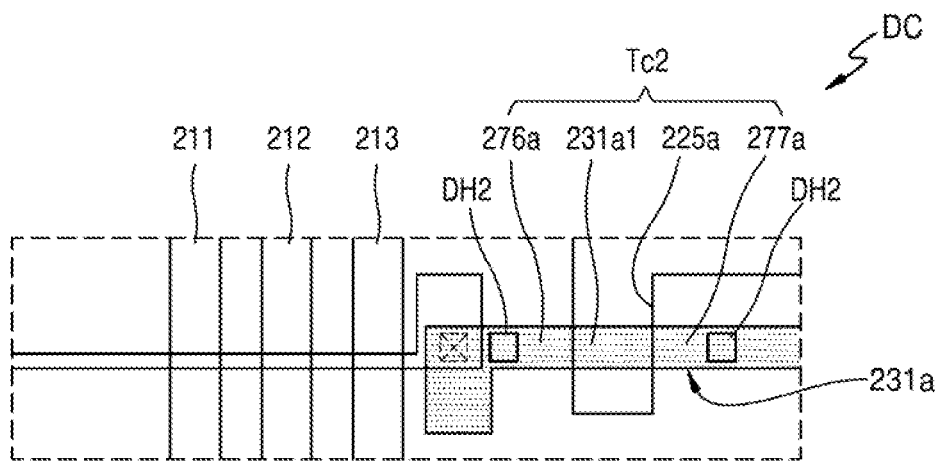

Referring to FIGS. 13A and 13B, each of the pixel circuit PC and the driver circuit DC includes a plurality of TFTs. For convenience of description, FIG. 13A illustrates a driving TFT Tp1 of the pixel circuit PC, and FIG. 13B illustrates a TFT Tc2 for a first driver circuit of the driver circuit DC.

A driving semiconductor pattern 131$a$ of the driving TFT Tp1 includes a driving channel region 131$a$1, a driving source region 176$a$ and a driving drain region 177$a$ located at both sides of the driving channel region 131$a$1 and including impurities of higher concentration than that of the driving channel region 131$a$1. The driving channel region 131$a$1 overlaps a driving gate electrode 125$a$ with a gate insulating layer disposed therebetween.

A semiconductor pattern 231$a$ of the TFT Tc2 for the first driver circuit includes a channel region 231$a$1, a source region 276$a$ and a drain region 277$a$ located at both sides of the channel region 231$a$1 and including impurities of higher concentration than that of the channel region 231$a$1. The channel region 231$a$1 overlaps a gate electrode 225$a$ with a gate insulating layer disposed therebetween. In an exemplary embodiment, the gate insulating layer of the driving TFT Tp1 and the gate insulating layer of TFT Tc2 for the first driver circuit may be formed using the same process An insulating layer covers the driving TFT Tp1 and the TFT Tc2 for the first driver circuit, and the number of first dummy holes DH1 penetrating the insulating layer is different from the number of second dummy holes DH2 penetrating the insulating layer.

According to an exemplary embodiment, the number of first dummy holes DH1 adjacent to the driving TFT Tp1 is greater than the number of second dummy holes DH2 adjacent to the TFT Tc2 for the first driver circuit. Therefore, the large amount of hydrogen ions contained in the semiconductor pattern 131$a$ of the driving TFT Tp1 evaporate like those contained in the first TFT T1, but the small amount of hydrogen ions contained in the semiconductor pattern 231$a$ of the TFT Tc2 for the first driver circuit evaporate like those contained in the second TFT T2.

The driving TFT Tp1 and the TFT Tc2 for the first driver circuit may have different characteristics by differing the numbers of first and second dummy holes DH1 and DH2 in the manufacturing of the driving TFT Tp1 and the TFT Tc2 using the same process, which is described with reference to FIGS. 4A to 8C.

Figure 14A:
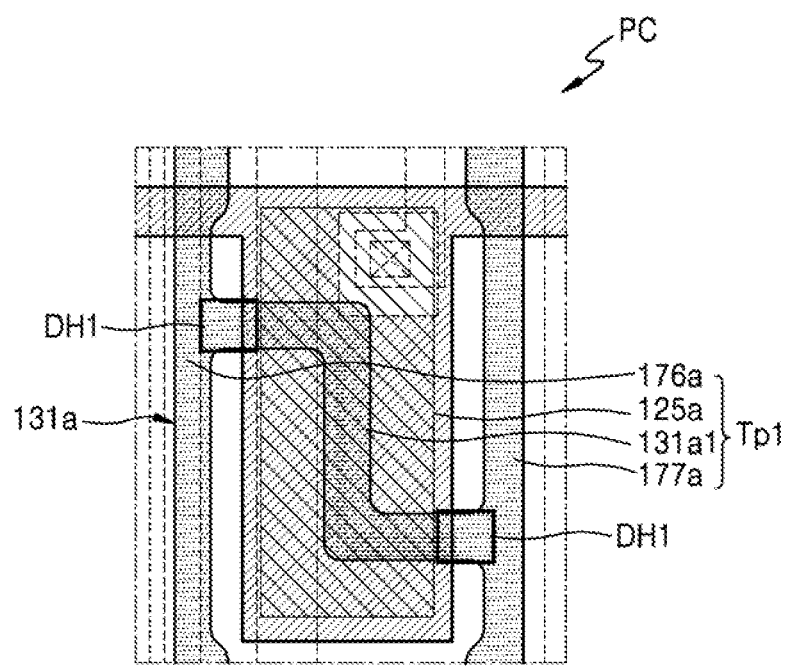
FIGS. 14A and 14B are plan views illustrating a pixel circuit located in a display area and a driver circuit located in a non-display area of an organic light-emitting display device according to an exemplary embodiment of the present invention.
Figure 14B:
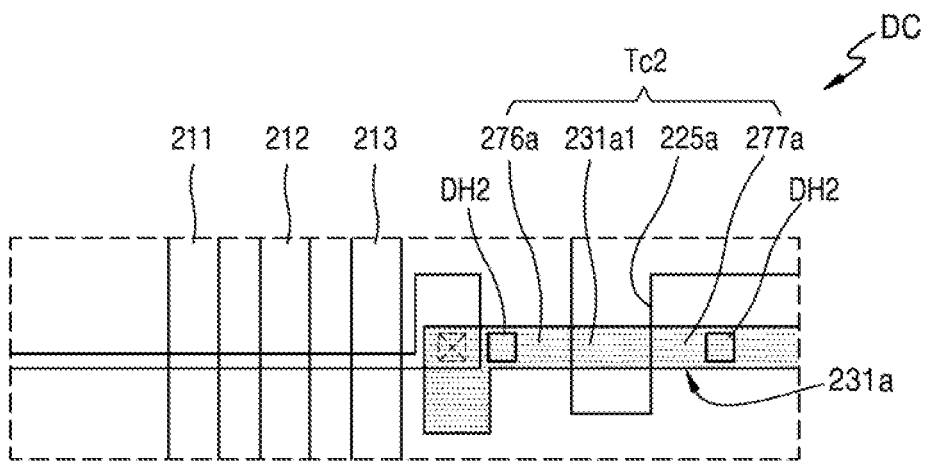

In FIGS. 13A and 13B, the number of first dummy holes DH1 is different from the number of second dummy holes DH2. The present invention is not limited thereto. For example, as illustrated in FIGS. 14A and 14B, the driving TFT Tp1 and the TFT Tc2 for the first driver circuit may have different characteristics in the manufacturing of the driving TFT Tp1 and the TFT Tc2 for the first driver circuit by differing the sizes of the first and second dummy holes DH1 and DH2 using the same process.

While the present invention has been shown and described with reference to exemplary embodiments thereof, it will be apparent to those of ordinary skill in the art that various changes in form and detail may be made therein without departing from the spirit and scope of the present invention as defined by the following claims.

What is claimed is:

1. An organic light emitting display device comprising:
a substrate;
a first thin film transistor having a first semiconductor pattern disposed on the substrate;
a second thin film transistor having a second semiconductor pattern disposed on the substrate;
a first insulating layer covering the first thin film transistor and the second thin film transistor;
a second insulating layer on the first insulating layer;
at least one first dummy hole passing through the first insulating layer and extending directly onto an upper surface of the first semiconductor pattern of the first thin film transistor;
at least one second dummy hole adjacent to the at least one first dummy hole and passing through the second insulating layer, the at least one second dummy hole extending directly onto an upper surface of the first insulating layer and being spaced apart from the at least one first dummy hole; and
a third insulating layer disposed on the second insulating layer,
wherein the at least one first dummy hole is filled only by a portion of the second insulating layer and does not contain any electrical connections, and
wherein the at least one second dummy hole is filled only by a portion of the third insulating layer and does not contain any electrical connections.

2. The organic light emitting display device of claim 1, wherein the third insulating layer comprises an organic insulating material.

3. The organic light emitting display device of claim 1, further comprising:
a third dummy hole passing through the first insulating layer and overlapping the first semiconductor pattern, wherein the third dummy hole does not contain any electrical connections; and
a fourth dummy hole passing through the first insulating layer and overlapping the second semiconductor pattern, wherein the fourth dummy hole does not contain any electrical connections.

4. The organic light emitting display device of claim 1, wherein each of the first semiconductor pattern of the first thin film transistor and the second semiconductor pattern of the second thin film transistor comprises polysilicon.

5. The organic light emitting display device of claim 1, wherein the substrate comprises a display area comprising a plurality of pixels, and
wherein the first thin film transistor and the second thin film transistor are located in at least one of the plurality of pixels.

6. The organic light emitting display device of claim 5, wherein
the first thin film transistor comprises a driving thin film transistor, and
the second thin film transistor comprises a switching thin film transistor.

7. The organic light emitting display device of claim 6, wherein a number or a size of the at least one first dummy hole is greater than a number or a size of the at least one second dummy hole.

8. The organic light emitting display device of claim 1, wherein the substrate comprises a display area comprising a plurality of pixel regions and a non-display area surrounding the display area, and wherein the first thin film transistor is located in the pixel region, and the second thin film transistor is located in the non-display area.

9. The organic light emitting display device of claim 1, wherein the substrate comprises a display area comprising a plurality of pixel regions and a non-display area surrounding the display area, and
wherein the first thin film transistor and the second thin film transistor are located in the non-display area.

10. The organic light emitting display device of claim 9, wherein a channel length of the first thin film transistor is different from a channel length of the second thin film transistor.

11. The organic light-emitting display device of claim 1, further comprising:
a display element disposed on the first and second thin film transistors.

12. An organic light emitting device comprising:
a substrate;
a first thin film transistor having a first semiconductor pattern disposed on the substrate;
a first insulating layer covering the first thin film transistor;
a second insulating layer covering the first insulating layer;
a third insulating layer covering the second insulating layer;
a first contact hole passing through the first insulating layer;
a wiring in contact with the first semiconductor pattern though the first contact hole;
at least one first dummy hole passing through the first insulating layer to extend directly onto an upper surface of the first semiconductor pattern of the first thin film transistor, wherein the at least one first dummy hole is defined by a side surface of the first insulating layer and does not contain any electrical connections such that the second insulting layer is in contact with the first semiconductor pattern through the at least one first dummy hole, and
at least one second dummy hole being spaced apart from the at least one first dummy hole, the at least one second dummy hole passing through the first and the second insulating layers to extending directly onto the upper surface of the first semiconductor pattern of the first thin film transistor, wherein the at least one second dummy hole is defined by side surfaces of the first and second insulating layers and does not contain any electrical connections such that the third insulting layer is in contact with the first semiconductor pattern through the at least one second dummy hole.

13. The organic light emitting device of claim 12,
wherein the first insulating layer includes silicon oxide or silicon nitride, and
wherein the second insulating layer includes an acryl-based organic material or benzocyclobutene (BCB).

14. The organic light emitting device of claim 12,
wherein the first insulating layer includes silicon oxide or silicon nitride, and
wherein the second insulating layer includes an acryl-based organic material or benzocyclobutene (BCB), and
wherein the third insulating layer includes silicon oxide or silicon nitride.

15. The organic light emitting device of claim 12, further comprising:
a second thin film transistor having a second semiconductor pattern disposed on the substrate, wherein the second thin film transistor is covered with the first and second insulating layers;
at least one other second dummy hole passing through the first insulating layer to expose the second semiconductor pattern, wherein the at least one other second dummy hole does not contain any electrical connections,
wherein the second insulating layer is in contact with the at least one other second semiconductor pattern through the other second dummy hole.

16. The organic light emitting device of claim 12,
wherein the at least one first dummy hole includes a first number of dummy holes and the at least one second dummy hole includes a second number of dummy holes, and
wherein the first number is less than the second number.

17. The organic light emitting device of claim 12, wherein the at least one first dummy hole has a first diameter and the at least one second dummy hole has a second diameter greater than the first diameter.

18. The organic light emitting device of claim 15, further comprising:
a scan signal line;
a power line;
a storage capacitor having a first electrode and a second electrode,
wherein the scan line is connected to a gate electrode of the first thin film transistor,
wherein the second electrode is connected to the power line, and
wherein the first electrode serves as a gate electrode of the second thin film transistor.

* * * * *